United States Patent
Pichler et al.

(10) Patent No.: US 11,071,193 B2
(45) Date of Patent: Jul. 20, 2021

(54) DEVICE FOR PRODUCING A NON-THERMAL ATMOSPHERIC PRESSURE PLASMA AND ACTIVE SPACE COMPRISING SUCH A DEVICE

(71) Applicants: TDK Electronics AG, Munich (DE); relyon plasma GmbH, Regensburg (DE)

(72) Inventors: Johann Pichler, Breitenau am Hochlantsch (AT); Georg Kügerl, Eibiswald (AT); Markus Puff, Graz (AT); Pavol Kudela, Deutschlandsberg (AT); Stefan Nettesheim, Regensburg (DE); Dariusz Korzec, Wenzenbach (DE); Dominik Burger, Alteglofsheim (DE)

(73) Assignees: RELYON PLASMA GMBH, Regensburg (DE); TDK ELECTRONICS AG, Munich (DE)

( * ) Notice: Subject to any disclaimer, the term of this patent is extended or adjusted under 35 U.S.C. 154(b) by 0 days.

(21) Appl. No.: 16/494,274

(22) PCT Filed: Mar. 14, 2018

(86) PCT No.: PCT/EP2018/056410
§ 371 (c)(1),
(2) Date: Sep. 13, 2019

(87) PCT Pub. No.: WO2018/167156
PCT Pub. Date: Sep. 20, 2018

(65) Prior Publication Data
US 2020/0077503 A1 Mar. 5, 2020

(30) Foreign Application Priority Data
Mar. 14, 2017 (DE) .......................... 102017105430.8

(51) Int. Cl.
*H01H 1/24* (2006.01)
*H01H 41/04* (2006.01)
(Continued)

(52) U.S. Cl.
CPC ......... *H05H 1/2475* (2013.01); *H01L 41/044* (2013.01); *H01L 41/0533* (2013.01); *H01L 41/107* (2013.01); *H05H 2001/2481* (2013.01)

(58) Field of Classification Search
CPC ...... H05H 1/24; H05H 1/2406; H05H 1/2475; H05H 1/46; H05H 2001/2481;
(Continued)

(56) References Cited

U.S. PATENT DOCUMENTS 8,651,120 B2   2/2014   Devery et al.
9,788,404 B2   10/2017  Nettesheim et al.
(Continued)

FOREIGN PATENT DOCUMENTS

CN   1820723 A   8/2006
CN   1864820 A   11/2006
(Continued)

*Primary Examiner* — Thai Pham
(74) *Attorney, Agent, or Firm* — Slater Matsil, LLP

(57) ABSTRACT

A device for producing a non-thermal atmospheric pressure plasma and an active space including such a device are disclosed. In an embodiment a device includes a first housing, in which a piezoelectric transformer is arranged and a second housing, in which a control circuit is arranged, the control circuit configured to apply an input voltage to the piezoelectric transformer, wherein the first housing comprises a coating configured to eradicate irritant gases.

40 Claims, 8 Drawing Sheets

(51) Int. Cl.
 *H05H 1/24* (2006.01)
 *H01L 41/04* (2006.01)
 *H01L 41/053* (2006.01)
 *H01L 41/107* (2006.01)

(58) Field of Classification Search
 CPC ............ H05H 2240/10; H05H 2240/20; H01L 41/042; H01L 41/044; H01L 41/107; H01L 41/053; H01L 41/04
 See application file for complete search history.

(56) References Cited

U.S. PATENT DOCUMENTS

| | | | |
|---|---|---|---|
| 10,143,510 | B2 | 12/2018 | Nettesheim et al. |
| 10,624,197 | B2 | 4/2020 | Weilguni et al. |
| 2009/0122941 | A1* | 5/2009 | Engemann ............ H05H 1/2475 376/145 |
| 2010/0237048 | A1 | 9/2010 | Brothier et al. |
| 2015/0054405 | A1 | 2/2015 | Nettesheim |
| 2015/0069911 | A1* | 3/2015 | Nettesheim ............ B23K 10/00 315/111.21 |
| 2015/0373824 | A1* | 12/2015 | Nettesheim ........... H01L 41/053 315/111.21 |
| 2016/0129142 | A1 | 5/2016 | Nettesheim |
| 2016/0287310 | A1 | 10/2016 | Nettesheim et al. |
| 2017/0208675 | A1* | 7/2017 | Doellgast ............. H01L 41/047 |
| 2018/0249569 | A1 | 8/2018 | Weilguni et al. |
| 2018/0368244 | A1* | 12/2018 | Rinner ................. H01L 41/044 |

FOREIGN PATENT DOCUMENTS

| | | |
|---|---|---|
| CN | 102771193 A | 11/2012 |
| CN | 103285718 A | 9/2013 |
| CN | 103418086 A | 12/2013 |
| CN | 105103319 A | 11/2015 |
| CN | 106061553 A | 10/2016 |
| CN | 106310524 A | 1/2017 |
| CN | 205964705 U | 2/2017 |
| DE | 19512228 A1 | 9/1996 |
| DE | 202008008980 U1 | 9/2008 |
| DE | 202008008733 U1 | 11/2009 |
| DE | 102012103938 A1 | 11/2013 |
| DE | 102013107448 A1 | 1/2015 |
| DE | 102013109887 A1 | 3/2015 |
| DE | 102013113941 A1 | 6/2015 |
| DE | 102015113656 A1 | 2/2017 |
| EP | 2638960 A1 | 9/2013 |
| JP | 2004268009 A | 9/2004 |
| JP | 2012200459 A | 10/2012 |
| JP | 2013128681 A | 7/2013 |
| JP | 2015522901 A | 8/2015 |
| JP | 2016531654 A | 10/2016 |
| WO | 2009047284 A1 | 4/2009 |
| WO | 2013164406 A1 | 11/2013 |
| WO | 2014115050 A1 | 7/2014 |
| WO | 2015008191 A1 | 1/2015 |
| WO | 2015047473 A2 | 4/2015 |
| WO | 2016192986 A1 | 12/2016 |
| WO | 2017025923 A1 | 2/2017 |
| WO | 2017029099 A1 | 2/2017 |

* cited by examiner

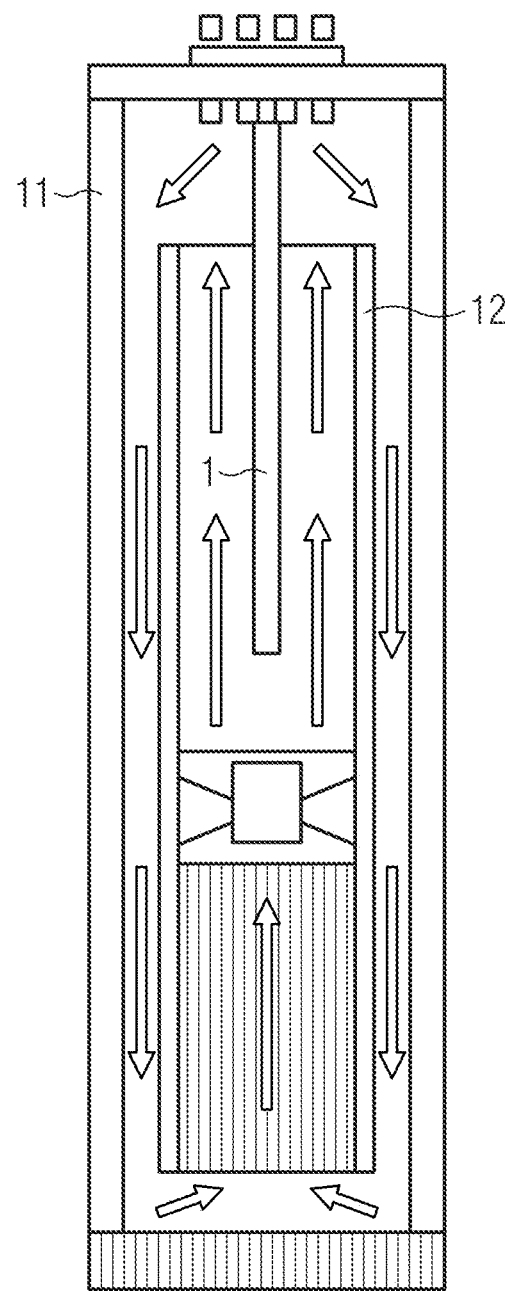

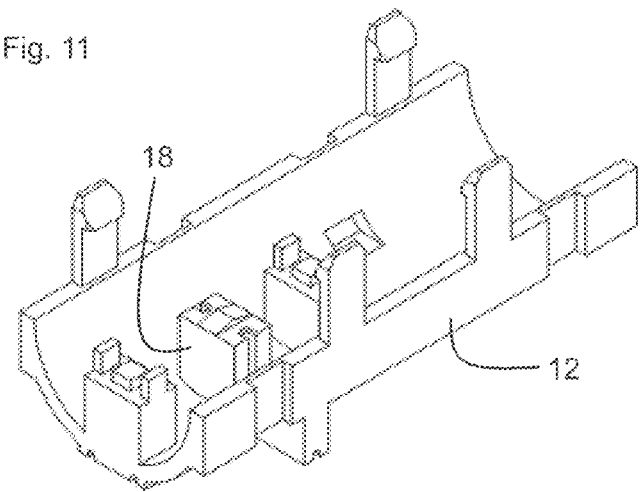
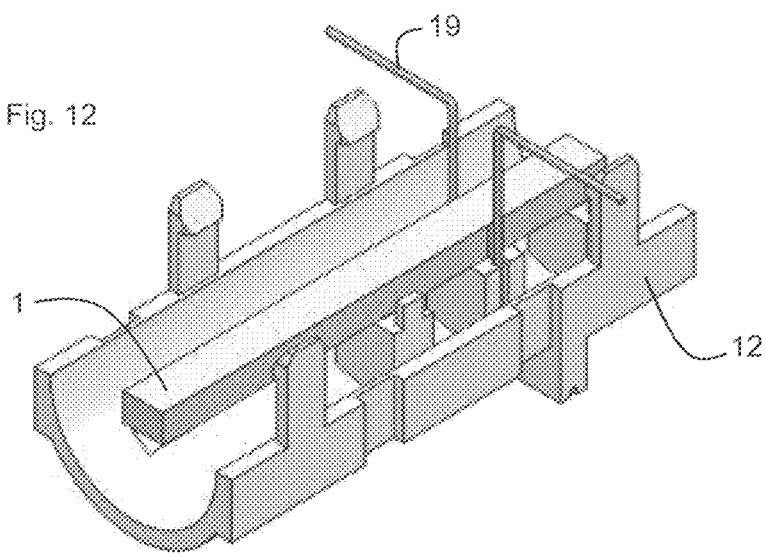

DEVICE FOR PRODUCING A NON-THERMAL ATMOSPHERIC PRESSURE PLASMA AND ACTIVE SPACE COMPRISING SUCH A DEVICE

This patent application is a national phase filing under section 371 of PCT/EP2018/056410, filed Mar. 14, 2018, which claims the priority of German patent application 102017105430.8, filed Mar. 14, 2017, each of which is incorporated herein by reference in its entirety.

TECHNICAL FIELD

The present invention relates to a device for producing a non-thermal atmospheric pressure plasma. The present invention further relates to an active space comprising such a device.

SUMMARY OF THE INVENTION

The non-thermal atmospheric pressure plasma can be produced using a piezoelectric transformer. In particular, the transformer can be a Rosen-type transformer.

Embodiments provide an improved device for producing non-thermal atmospheric pressure plasma, which, for example, has a long service life. The device should preferably be suitable for use in an active space, for example, a refuse bin, a garbage can, a sports bag, a closet or a garment bag.

Various embodiments provide a device for producing a non-thermal atmospheric pressure plasma comprising a first housing, in which a piezoelectric transformer is arranged, and a second housing, in which a control circuit is arranged, which is designed to apply an input voltage to the piezoelectric transformer. Accordingly, the piezoelectric transformer and the control circuit can be spatially separated from each other by the first and the second housing.

The control circuit comprises a time circuit, which applies the input voltage to the piezoelectric transformer for a predefined period of time and which does not apply any input voltage to the piezoelectric transformer at a predefined pause interval between two periods of time, wherein the application of the input voltage is prevented for the duration of the pause interval. In the pause interval, it therefore cannot be possible to apply an input voltage to the piezoelectric transformer. As a result, a quantity of ozone which can be produced by the device can be limited to a level that is not harmful to health. Plasma and ozone generation cannot be possible during the pause interval.

The device can be operated in a pulsed mode, in which the transformer can be activated on the basis of the time circuit without taking into account other operating parameters of the transformer and be deactivated for the duration of the pause intervals. In any case, the purely time-based control system can allow the ozone generation rate to be limited to a level that is harmless to health.

This arrangement of the piezoelectric transformer in the first housing and the control circuit in the second housing brings numerous advantages. If a plasma is generated with the piezoelectric transformer, irritant gases, such as ozone, can form during plasma production. These irritant gases are sometimes aggressive and can damage the control circuit over time. However, since the control circuit is arranged here in the second housing, damage to the control circuit by the irritant gases can be prevented. This can increase the service life of the device. The first housing and the second housing can preferably be designed in such a way that a gas exchange between the two housings is minimized. Accordingly, an irritant gas produced in the first housing cannot enter the second housing or can only enter the second housing in a negligible concentration.

In the output region of the piezoelectric transformer, electric fields with high field strengths can be created during plasma generation. The spatial separation of the piezoelectric transformer and the control circuit can ensure that the control circuit is not affected by the electric fields in an undesirable way.

Furthermore, by means of the arrangement of the transformer in the first housing and the arrangement of the control circuit in the second housing, a user can be better protected from irritant gases. The user will usually operate the second housing to switch on the control circuit or make changes to the control system. Since the piezoelectric transformer is arranged separately therefrom in the first housing, irritant gases are only produced in the vicinity of the first housing and hence, not in the immediate vicinity of the user. This can increase user safety. This can make it possible to use the device in end products for end users who are subject to high safety level requirements.

By dividing it into separate housings, the device can be easy to handle. The device can be designed in a small and compact manner.

For example, the piezoelectric transformer used here can be a component marketed by EPCOS under the name CeraPlas™.

The piezoelectric transformer can be designed to produce a piezoelectrically ignited microplasma on an output-side end face of the piezoelectric transformer. This can be so-called Piezoelectric Direct Discharge Plasma (PDD). The plasma can therefore form directly at the piezoelectric transformer. Thereby, no additional dielectric barrier is provided in front of the output-side end face.

Alternatively, a dielectric barrier can be arranged directly in front of the output-side end face of the transformer, wherein the barrier can be formed, for example, by an attachment. In this case, the plasma can be produced similarly to a dielectric barrier discharge (DBD). However, in contrast to a "classic" dielectric barrier discharge, the barrier is not connected to a high-voltage source by a cable, but is located in close spatial proximity to the piezoelectric transformer so that a high voltage generated by the transformer can be capacitively coupled into an ignition chamber, which is separated from the transformer by the barrier.

The first housing and the second housing can be separate from each other. The housings cannot be designed as a single piece. The first housing is not arranged inside the second housing and the second housing is not arranged inside the first housing. The housings can be spatially separated from each other. The housings can be arranged side by side, wherein the two housings are either directly connected to each other or arranged at a distance from each other. The first housing and the second housing can be designed to provide a spatial separation between the piezoelectric transformer and the control circuit. The first housing and the second housing can be designed to ensure that a gas exchange between the two housings only takes place to an insignificant extent.

The control circuit and the piezoelectric transformer can be connected to each other via a cable. The cable can make it possible to apply an alternating voltage output by the control circuit to the external electrodes of the piezoelectric transformer as input voltage. The control circuit can be designed in such a way that it is not influenced by the impedance of the cable. Accordingly, the cable can have a length of up to 10 m. The cable can have a length of at least 1 cm. The cable preferably has a length ranging between 10 cm and 100 cm.

In the first housing there can be arranged a control element, which makes it possible to control the plasma generation. Alternatively, the control element can be arranged in the second housing. For example, the control element can be a push-button, a knob, a microcontroller-controlled system with or without a touchscreen, a remote control or a system that is controlled via USB, WLAN or Bluetooth. Furthermore, it can be a control by means of software, such as an app. The control element can allow a user of the device to control the control circuit and to influence and read various parameters during plasma generation, such as the input voltage, the amount of the process gas that is supplied to the transformer, the concentration of the components of the process gas, the input power and the operating time.

If the control element is arranged on the second housing, it is spatially separated from the piezoelectric transformer located in the first housing. Accordingly, safety can be increased for a user who operates the control element, as he/she does not have to be in the immediate vicinity of the transformer, which can produce potentially harmful irritant gases.

The first housing can comprise a nozzle, which is arranged in front of an end face of the piezoelectric transformer and is designed to form a plasma beam generated by the piezoelectric transformer.

Furthermore, the first housing can have a dielectric barrier, which is arranged immediately in front of the piezoelectric transformer. The dielectric barrier can separate the piezoelectric transformer from an ignition chamber, in which the process medium is arranged. A high voltage generated by the piezoelectric transformer can be capacitively coupled in the ignition chamber via the dielectric barrier and trigger a plasma ignition there. Such an embodiment is particularly advantageous in the case of liquid process media or in the case of biological tissue as a process medium. In this case, the piezoelectric transformer does not come into direct contact with the process medium. This direct contact would mechanically dampen the transformer and it could no longer be used to generate plasma. Since direct contact is prevented by the barrier, mechanical damping can be prevented from the beginning. The arrangement of a dielectric barrier in front of the transformer is also useful for other process media that are very aggressive and could damage the piezoelectric transformer.

The device can comprise a third housing, which also comprises a piezoelectric transformer. The first housing can be replaceable and be replaced by the third housing. In this case, the control circuit after the replacement of the first housing by the second housing can be designed to apply the input voltage to the piezoelectric transformer arranged in the third housing.

Accordingly, the piezoelectric transformer can be replaced together with the first housing. The piezoelectric transformer is the component of the device that is most exposed to signs of wear. By means of the embodiment, in which the first housing is replaceable, it is made possible to replace only the transformer and to continue to use the control circuit and other elements, which are arranged in the second housing.

The piezoelectric transformer can be replaced as a module together with the first housing. The first housing and the second housing can be connected to each other via a detachable connection, for example, a plug connection, a USB connection or a bayonet connection. Such a connection is easy for a user to detach so that a replacement of the module with the first housing and the piezoelectric transformer can be made in a simple manner. On the other hand, replacing the piezoelectric transformer without simultaneously exchanging the first housing would be considerably more complex since, in this case, the attachment of the transformer to the housing would have to be detached.

The third housing can comprise a nozzle. The first housing can also comprise a nozzle. The nozzles can be designed to shape the plasma beam in different ways or to attach a dielectric barrier in front of the transformer. Accordingly, the first housing and the third housing can be interchanged among each other to change a form of the plasma beam in a desired way. A separate replacement of only the nozzle without replacing the entire first housing, on the other hand, would be considerably more complex since, in this case, the attachment of the nozzle to the housing would have to be detached and the new nozzle would have to be attached to the housing again.

In an alternative exemplary embodiment, the nozzle can be replaced separately. A nozzle attached to the first housing or to the third housing can in this case be replaceable. Preferably, the nozzle is in this case attached to the respective housing by means of an attachment that can be easily detached.

For example, the nozzle can be attached to the respective housing by means of a bayonet connection. The nozzle can also be attached to the respective housing by means of a snap-on connection or a screw connection.

The first housing can be designed to eradicate irritant gases produced during plasma production. For this purpose, the first housing can comprise a coating. The coating can, for example, comprise manganese dioxide, iron oxide, other metal oxides, bare metal surfaces or surfaces coated with metal catalysts, or lacquers. In addition, or as an alternative, the housing can comprise a filter to eradicate the irritant gases. For example, the filter can be an activated-carbon filter. In addition, or as an alternative, the housing can be designed in such a way that a closed gas guidance system results, in which irritant gases are prevented from flowing out of the housing. In addition, or as an alternative, the housing can comprise a suction device. This can be designed to suck up irritant gases immediately after their production. At most only partial gas recirculation into the first housing can also be provided, wherein the first housing for the eradication of the irritant gas can be appropriately coated.

The device can comprise a control mechanism, which makes it possible to adjust an amount of a process medium, which is supplied to the piezoelectric transformer. In addition, or as an alternative, the control mechanism also can make it possible to adjust a composition of the process medium.

The device can comprise an attachment, which is attached to the first housing and which forms a dielectric barrier immediately in front of an output-side end face of the piezoelectric transformer, so that the device is designed to ignite a plasma by means of a dielectric barrier discharge on a side of the dielectric barrier facing away from the transformer.

A plurality of piezoelectric transformers can be arranged in the first housing. The control circuit arranged in the second housing can be connected to each of the transformers and designed to apply an input voltage to each of the transformers.

The control circuit can comprise a time circuit, which applies the input voltage to the piezoelectric transformer for a predefined period of time and which does not apply any input voltage to the piezoelectric transformer at a predefined pause interval between two periods of time. For example, an input voltage can be applied to the transformer for a period of 15 seconds and no input voltage can be applied during a pause interval lasting 2 hours. In this way, energy consumption of the device can be minimized and the irritant gas concentration can be limited.

The first housing and the second housing can be formed by two chambers of an injection-molded part. The first housing and the second housing can be separated from each other in a watertight manner. The first housing and the second housing can be separated from each other in a gastight manner.

In the second housing there can be arranged energy supply means of the device. The energy supply means can be, for example, a battery, rechargeable batteries that can be charged in one embodiment by means of contactless inductive charging, or a transformer designed to convert a mains voltage into an operating voltage of the device. Since the energy supply means are arranged in the second housing, they can be reused when the first housing is replaced.

The device can be a portable handheld device.

In the second housing there can be arranged process-gas-supply means, wherein the device comprises a hose, which is designed to guide a process gas from the process-gas-supply means out of the second housing to the piezoelectric transformer arranged in the first housing. The hose can be integrated into a cable that connects the first housing to the second housing. If the first housing is replaced, the process-gas-supply means can thus be reused. The process-gas-supply means can be, for example, a fan, a compressor or a connection for various compressed gas tanks, using a gas mixer if applicable. Furthermore, the process-gas-supply means can comprise a pressure reducer, a mass flow controller, a gas humidifier, a gas dryer, an atomizer and a nebulizer. Alternatively, the means for process gas management can also be integrated into the first housing.

The medium in which the plasma is ignited can be referred to as the medium medium. For example, the process medium can be ambient air of the piezoelectric transformer. The process medium can also be any material present that is gaseous at the operating temperature and the operating pressure, all conceivable material mixtures that are gaseous at the operating temperature and the operating pressure, an aerosol, which comprises liquid and/or solid particles floating in gas, a liquid, or biological tissue. The operating pressure and the operating temperature indicate the pressure or the temperature at which the device for producing the non-thermal atmospheric pressure plasma is commonly used. In particular, the operating pressure can be an atmospheric pressure. The operating pressure can be between 0.2 bar and 1.5 bar, preferably between 0.8 bar and 1.2 bar. The operating temperature can be, in particular, a room temperature. The operating temperature can be in a range between −50° C. and +155° C., preferably between 0° C. and 45° C.

If the process medium is a gaseous substance, it can be, for example, a pure gas, for example, pure He, pure Ar, pure $N_2$, pure $O_2$, pure $CO_2$, pure $H_2$ or pure $Cl_2$. Furthermore, the process medium $H_2O$ can be in the supercritical area. The process medium can have supercritical, meaning, non-condensable pure substances at the operating temperature and operating pressure.

The process medium can comprise one or a mixture of a plurality of the aforementioned pure gases or the following gases: air, inert gas and forming gas. The process medium is selected in such a way that the gas state is maintained at the operating temperature and operating pressure.

The process medium can have a liquid aerosol in a gas or a gas mixture. For example, it can be air above the dew point, saturated steam or a gasoline/diesel air mixture. The process medium can have a solid aerosol in a gas or a gas mixture. This can be, for example, soot in exhaust gas or particulate matter in air. For medical and technical applications, particularly good results can be achieved when using aerosols as a process medium. The aerosol can, in particular, be water droplets in air. It can also be droplets of $H_2O_2$ or formaldehyde. By treating the water droplets with plasma, OH radicals can be produced. In addition, water droplets can be used to bind the resulting irritant gases, such as ozone or nitric oxide, and thus to reduce the environmental load with these gases in order to increase the application safety. This irritant gas binding can additionally cause an increase in activity by irritant gas in particular for sterilization, for example, by ozone dissolved in water droplets. The device could also be used in exhaust gas streams for particle separation. The device could also be used in steam circuits or sanitary rooms, as well as their ventilation circuits, wherein also aerosols can form the process medium.

The device can comprise a suction spout, which is designed to suck up an irritant gas produced by the piezoelectric transformer, wherein the irritant gas is eradicated in the suction spout.

The device can comprise a sensor for determining a filling level, temperature or humidity. The sensor measures the corresponding parameter inside or around the active space.

The device can include circuit components of a remote control. The circuit components are used to control a control system. The remote control can allow by way of a program or an app for a computer, such as a PC or a mobile communication device, to read out the state of the device or to control the device.

The device can comprise circuit elements for recording parameters such as the operating time, errors that have occurred, status information or other operating parameters. By means of a memory, it is possible to obtain values in a log file.

The device can comprise one or a plurality of indicators for the optical or acoustic signaling of one or a plurality of operating parameters.

The device can be provided and suitable for enabling, accelerating or catalyzing chemical reactions.

The device can be provided and suitable for activating or sterilizing surfaces.

The device can be provided and suitable for treating or cleaning living and biological tissue. In particular, it can be used for the treatment or purification of open or closed or poorly healing wounds inside or on the exterior of a living human or animal body. In particular, the application to skin wounds is preferred, wherein these wounds can be, in particular, poorly healing, poorly supplied with blood or germ-infected wounds.

In the first housing there can be arranged a fan and a catalytic converter, wherein the fan is designed to ensure a circulating air operation where a process medium ionized by the piezoelectric transformer in the first housing is guided within a circuit, and thereby is guided through the catalytic converter before the process medium is supplied back to the piezoelectric transformer.

The first housing can comprise a heat exchanger, which is arranged and designed to dissipate heat from the inside of the first housing to an environment.

The input region of the piezoelectric transformer can rest on a first support element, wherein the device comprises at least one projection, which is at a distance from the piezoelectric transformer if the transformer is at a state of rest, and which forms an end-stop against transverse movements of the piezoelectric transformer. The projection can be arranged at half the length of the transformer. The projection can be at a distance from the piezoelectric transformer when the transformer is at a state of rest.

The spacing of the projection is chosen in such a way that the piezoelectric transformer does not hit the projection at its state of rest, even with normal manufacturing tolerances and thermal expansions. The projection is arranged in such a way that it limits movements of the transformer due to deformations of the transformer during operation and/or due to impacts on the device and forms an end-stop for the transformer in the case of such movements.

The device can comprise a second projection, which is at a distance from the piezoelectric transformer when the transformer is at a state of rest, and which forms an end-stop against transverse movements of the piezoelectric transformer, wherein the second projection is arranged at an input-side end of the transformer. The spacing of the second projection is chosen in such a way that the piezoelectric transformer does not hit the second projection at its state of rest, even with normal manufacturing tolerances and thermal expansions. The second projection is arranged in such a way that it limits movements of the transformer due to deformations of the transformer during operation and/or due to impacts on the device and forms an end-stop for the transformer at such movements.

According to a further aspect, a device for producing a non-thermal atmospheric pressure plasma is proposed, comprising a first housing, in which a piezoelectric transformer is arranged, and a second housing, in which a control circuit is arranged, which is designed to apply an input voltage to the piezoelectric transformer, wherein the first housing for eradicating the irritant gases comprises a coating. The coating can be manganese dioxide, iron oxide, other metal oxides, bare metal surfaces or a surface coated with metal catalysts, or lacquers.

According to a further aspect, a device for producing a non-thermal atmospheric pressure plasma is proposed, comprising a first housing, in which a piezoelectric transformer is arranged, and a second housing, in which a control circuit is arranged, which is designed to apply an input voltage to the piezoelectric transformer, and wherein in the first housing there is arranged at least one control element, which makes it possible to control the plasma generation.

According to a further aspect, the present invention relates to an active space comprising the device described above and a gas volume. The gas volume can be airtight or not be airtight. The device can be used to treat gas present in the gas volume with plasma and/or ozone, for example, to avoid or reduce an odor.

The active space can also be called the effective volume. The active space can be a spatially limited area, the content of which is treated with the plasma generated by the device. The active space can thereby be, for example, a reservoir. The active space does not necessarily have to comprise a closed volume. Rather, a continuous gas exchange can occur in an active space with a gas volume that is not airtight, so that the gas in the active space is continuously renewed or replaced.

A refuse bin, a garbage can and a plastic bag can, for example, form an active space with an airtight gas volume. A sports bag or a cotton bag can form an active space with a gas volume that is not airtight. Furthermore, the use in cabinets, for example, closets, is conceivable as an active space. It can also be used in garment bags or shoe bags.

If the device is used in an active space with a gas volume that is not airtight, precautions can preferably be taken to limit an irritant gas concentration and quickly break it down. In particular, the first housing that has the transformer, as already discussed above, can be designed to eradicate irritant gases produced during the plasma production. For this purpose, the first housing can comprise a coating, for example, manganese dioxide or iron oxide. As an alternative or in addition, the housing can comprise a filter to eradicate the irritant gases. As an alternative or in addition, the housing can be designed in such a way that a closed gas guidance system results, in which irritant gases are prevented from flowing out of the housing. As an alternative or in addition, the housing can comprise a suction device that is designed to suck up irritant gases directly after they are produced. Alternatively, the housing can have a partial irritant gas guide or (gas) return, wherein the housing for the eradication of the irritant gases can be appropriately coated. Furthermore, the device can have an acoustic and/or optical warning device designed to alert a user in the event of a questionable irritant gas concentration. As an alternative or in addition, the device can be designed to automatically switch off at an irritant gas concentration above a threshold value. The device can also be designed to switch on again when the irritant gas concentration has fallen below the threshold value.

The device can be compactly integrated into the active space and comprise a perforation for ozone to flow out. The device can be removable from the active space. Alternatively, only the first housing can also be installed within the active space. The second housing can be arranged outside the active space.

The active space can, for example, have a cover, wherein the device or at least the first housing is arranged on the cover. A plasma outlet opening of the device can point away from the cover. The plasma outlet opening points in the direction of an active space or an effective volume. The device can alternatively be installed at another position in the active space, for example, in a side wall.

The device can comprise an outlet opening, from which plasma generated by the transformer can flow out. The device can be arranged in such a way that the outlet opening is arranged inside the active space. The device can also have an inlet opening, through which a gaseous process medium can penetrate into the first housing. The device can be arranged in such a way that the inlet opening is arranged outside the active space. Furthermore, the device can have a carbon filter, which is arranged between the inlet opening and the outlet opening and which separates the interior of the active space from the surroundings of the active space. In particular, the carbon filter can prevent an irritant gas produced inside the active space from entering the surroundings of the active space.

Alternatively or in addition to the carbon filter, the device, in particular to prevent an outlet of the irritant gas produced inside the active space into the surroundings of the active space, can be provided with a coating degrading irritant gas.

The active space can comprise a sensor, which is designed to detect an opening or closing of the cover, wherein the device is designed to produce a plasma after closing the cover. For example, the sensor can be an inclination sensor, an accelerometer, or a light sensor.

In the following, favorable aspects are described. To facilitate referencing, the aspects are numbered. Features of the aspects are relevant not only in combination with the specific aspect to which they relate, but also in a separate way.

Aspect 1: A device for producing a non-thermal atmospheric pressure plasma, comprising a first housing, in which a piezoelectric transformer is arranged, and a second housing, in which a control circuit is arranged, which is designed to apply an input voltage to the piezoelectric transformer.

Aspect 2: The device according to the previous aspect, wherein the piezoelectric transformer is designed to produce piezoelectrically ignited microplasma on an output-side end face of the piezoelectric transformer.

Aspect 3: The device according to any one of the previous aspects, wherein the first housing and the second housing are separate from each other.

Aspect 4: The device according to any one of the previous aspects, wherein the control circuit and the piezoelectric transformer are connected to each other via a cable.

Aspect 5: The device according to the previous aspect, wherein the cable has a length of at least 1 cm.

Aspect 6: The device according to any one of the previous aspects, wherein in the first housing there is arranged at least one control element, which makes it possible to control the plasma generation or wherein in the second housing there is arranged at least one control element, which makes it possible to control the plasma generation.

Aspect 7: The device according to any one of the previous aspects, wherein the first housing comprises a nozzle, which is arranged in front of an end face of the piezoelectric transformer and which is designed to form a plasma beam generated by the piezoelectric transformer.

Aspect 8: The device according to any one of the previous aspects, wherein the device comprises a third housing, which has a piezoelectric transformer, wherein the first housing is replaceable and can be replaced by the third housing.

Aspect 9: The device according to any one of the previous aspects, wherein the first housing is designed to eradicate irritant gases produced during the plasma production.

Aspect 10: The device according to the previous aspect, wherein the first housing comprises a coating and/or a filter and/or a closed gas guidance system and/or a suction device to eradicate the irritant gases.

Aspect 11: The device according to any one of the previous aspects, wherein the device comprises a control mechanism, which makes it possible to adjust the amount and/or a composition of a process medium, which is supplied to the piezoelectric transformer.

Aspect 12: The device according to any one of the previous aspects, wherein the device comprises an attachment, which is attached to the first housing and which forms a dielectric barrier immediately in front of an output-side end face of the piezoelectric transformer, so that the device is designed to ignite a plasma by means of a dielectric barrier discharge on a side of the dielectric barrier facing away from the transformer.

Aspect 13: The device according to any one of the previous aspects, wherein a plurality of piezoelectric transformers are arranged in the first housing.

Aspect 14: The device according to any one of the previous aspects, wherein the control circuit comprises a time circuit, which applies the input voltage to the piezoelectric transformer for a predefined period of time and which does not apply any input voltage to the piezoelectric transformer at a predefined pause interval between two periods of time.

Aspect 15: The device according to any one of the previous aspects, wherein the first housing and the second housing are formed by two chambers of an injection-molded part.

Aspect 16: The device according to any one of the previous aspects, wherein the first housing and the second housing are separated from each other in a watertight manner.

Aspect 17: The device according to any one of the previous aspects, wherein the first housing and the second housing are separated from each other in a gastight manner.

Aspect 18: The device according to any one of the previous aspects, wherein an energy supply of the device is arranged in the second housing.

Aspect 19: The device according to any one of the previous aspects, wherein the device is a portable handheld device.

Aspect 20: The device according to any one of the previous aspects, wherein process- gas-supply means are arranged in the second housing, wherein the device comprises a hose, which is designed to guide a process gas from the process-gas-supply means out of the second housing to the piezoelectric transformer arranged in the first housing.

Aspect 21: The device according to any one of the previous aspects, wherein the device comprises a suction spout, which is designed to suck up an irritant gas produced by the piezoelectric transformer, wherein the irritant gas is eradicated in the suction spout.

Aspect 22: The device according to any one of the previous aspects, furthermore comprising a sensor for determining a filling level, temperature or humidity inside or in the surroundings of the active space.

Aspect 23: The device according to any one of the previous aspects, furthermore comprising circuit components of a remote control for controlling a control system.

Aspect 24: The device according to any one of the previous aspects, furthermore comprising circuit elements for recording the operating time, errors, status information, operating parameters.

Aspect 25: The device according to any one of the previous aspects, furthermore comprising one or a plurality of indicators for the optical or acoustic signaling of one or a plurality of operating parameters.

Aspect 26: The device according to any one of the previous aspects, for enabling, accelerating or catalyzing chemical reactions.

Aspect 27: The device according to any one of the previous aspects, which is provided to activate or to sterilize surfaces.

Aspect 28: The device according to any one of the previous aspects, which is provided to clean or to treat wounds of a human or animal body.

Aspect 29: An active space comprising a device according to any one of the previous aspects and a gas volume that is airtight or a gas volume that is not airtight.

Aspect 30: The active space according to the previous aspect, wherein the active space comprises a cover and wherein the device is arranged on the cover, wherein a plasma outlet opening of the device points away from the cover.

Aspect 31: The active space according to the previous aspect, wherein the active space comprises a sensor, which is designed to detect an opening and closing of the cover, wherein the device is designed to produce plasma after closing the cover.

BRIEF DESCRIPTION OF THE DRAWINGS

In the following, the present invention is described in more detail based on the enclosed figures.

FIG. 10 shows a first housing according to a further exemplary embodiment;

FIGS. 11, 12 and 13 show a mounting for a piezoelectric transformer; and

DETAILED DESCRIPTION OF ILLUSTRATIVE EMBODIMENTS

Figure 1:
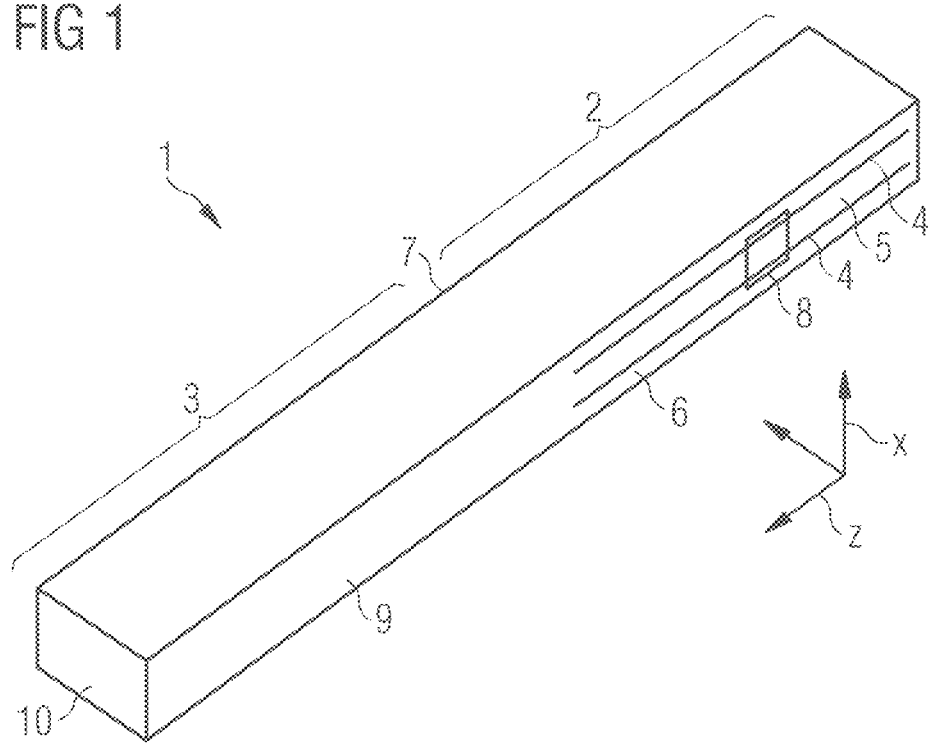
FIG. 1 shows a piezoelectric transformer in a perspective view.

FIG. 1 shows a piezoelectric transformer 1 in a perspective view. In particular, the piezoelectric transformer 1 can be used in a device for producing non-thermal atmospheric pressure plasma.

A piezoelectric transformer 1 is a design of a resonance transformer, which is based on piezoelectricity and, in contrast to the conventional magnetic transformers, represents an electromechanical system. For example, the piezoelectric transformer 1 is a Rosen-type transformer.

The piezoelectric transformer 1 has an input region 2 and an output region 3, wherein the output region 3 connects in a longitudinal direction z to the input region 2. In the input region 2, the piezoelectric transformer 1 comprises electrodes 4, to which an alternating voltage can be applied. The electrodes 4 extend in the longitudinal direction z of the piezoelectric transformer 1. The electrodes 4 are stacked alternately with a piezoelectric material 5 in a stacking direction x, which is perpendicular to the longitudinal direction z. The piezoelectric material 5 is polarized in the stacking direction x.

The electrodes 4 are arranged inside the piezoelectric transformer 1 and are also referred to as internal electrodes. The piezoelectric transformer 1 comprises a first side surface 6 and a second side surface 7, which is opposite the first side surface 6. On the first side surface 6 a first external electrode 8 is arranged. On the second side surface 7 a second external electrode (not shown) is arranged. The internal electrodes 4 are in the stacking direction x alternately contacted either with the first external electrode 8 or the second external electrode electrically.

The input region 2 can be controlled with a low alternating voltage, which is applied between the electrodes 4. Due to the piezoelectric effect, the alternating voltage applied on the input side is initially converted into a mechanical oscillation. The frequency of the mechanical oscillation depends essentially on the geometry, the mechanical structure and the material of the piezoelectric transformer 1.

The output region 3 comprises piezoelectric material 9 and is free of internal electrodes. The piezoelectric material 9 in the output region 3 is polarized in the longitudinal direction x. The piezoelectric material 9 of the output region 3 can be the same material as the piezoelectric material 5 of the input region 2, wherein the piezoelectric materials 5 and 9 can differ in their polarization direction. In the output region 3, the piezoelectric material 9 is formed into a single monolithic layer, which is completely polarized in the longitudinal direction z. The piezoelectric material 9 in the output region 3 has only one single polarization direction.

If an alternating voltage is applied to the electrodes 4 in the input region 2, a mechanical wave which generates an output voltage in the output region 3 by means of the piezoelectric effect is formed within the piezoelectric material 5, 9. The output region 3 comprises an output-side end face 10. In the output region 3, thus, an electrical voltage is generated between the end face 10 and the end of the electrodes 4 of the input region 2. A high voltage is generated at the output-side end face 10. This also creates a high potential difference between the output-side end face and surroundings of the piezoelectric transformer, sufficient to generate a strong electric field that ionizes a process medium. Furthermore, the generation of radicals, excited molecules or atoms in the plasma is possible.

In this way, the piezoelectric transformer 1 generates high electric fields, which are able to ionize gases or liquids by electrical excitation. Thereby, atoms or molecules of the respective gas or the respective liquid are ionized and form a plasma. An ionization always occurs if the electric field strength on the surface of the piezoelectric transformer 1 exceeds the ignition field strength of the plasma. The field strength that is required for the ionization of the atoms or molecules or for the generation of radicals, excited molecules or atoms is referred to as the ignition field strength of a plasma.

Figure 2:
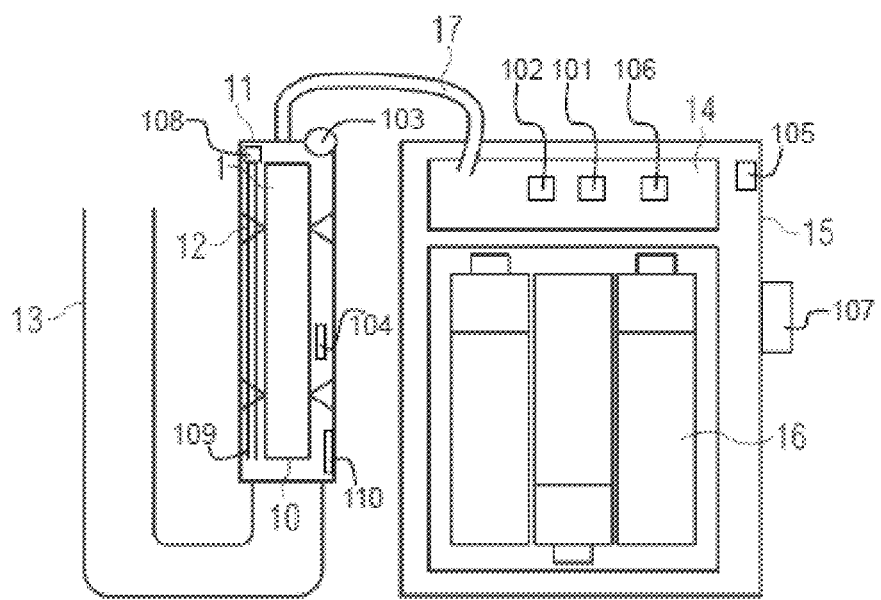
FIG. 2 shows a device for plasma generation according to a first exemplary embodiment.

FIG. 2 shows a device for plasma generation, which comprises the piezoelectric transformer 1 shown in FIG. 1. The device comprises a first housing 11, in which the piezoelectric transformer 1 is arranged. Furthermore, a mounting 12 which attaches the piezoelectric transformer 1 is arranged in the housing 11. The mounting 12 will be explained in greater detail below in connection with FIG. 3.

The first housing 1 also has a plasma outlet channel 13. The plasma outlet channel 13 is arranged in front of the output-side end face 10 of the piezoelectric transformer 1. If a process medium is ionized by the piezoelectric transformer 1 or if radicals, excited molecules or atoms are generated by the piezoelectric transformer 1, a plasma generated in this way is guided to a desired usage location via the plasma outlet channel 13.

The plasma outlet channel 13 is an optional embodiment of the device. Alternatively, the first housing 11 can have a simple opening from which the plasma generated by the piezoelectric transformer 1 can flow out. Alternatively, the housing 11 can comprise a nozzle designed to focus or to fan a plasma beam or which has a dielectric barrier.

The first housing 11 can furthermore comprise a switch for power and/or gas flow control, which makes it possible to adjust which amount of a process medium is supplied to the piezoelectric transformer 1. The first housing 11 can have a feedback mechanism, which can transmit information about the currently generated plasma to a control circuit 14, wherein the control circuit 14 can also be designed to adapt the control system of the piezoelectric transformer 1 by taking this information into account.

In the first housing 11 there can be arranged a fan 108 and a catalytic converter 109, wherein the fan 108 is designed to ensure a circulating air operation where a process medium ionized by the piezoelectric transformer 1 in the first housing 11 is guided within a circuit, and thereby is guided through the catalytic converter 109 before the process medium is supplied back to the piezoelectric transformer 1.

The first housing 11 can comprise a heat exchanger 110, which is arranged and designed to dissipate heat from the inside of the first housing 11 to an environment.

The device furthermore comprises a second housing 15. Further elements of the device are arranged in the second housing 15. In particular, a control circuit 14 for the piezoelectric transformer 1 is arranged in the second housing 15. Furthermore an energy supply 16 of the device is arranged in the second housing 15.

The control circuit 14 is designed to apply an input voltage to the piezoelectric transformer 1. The control circuit 14 is connected to the piezoelectric transformer 1 via a cable 17. Due to the design of the control circuit 14, in principle no significant restrictions have to be observed with regard to the cable length. Furthermore, the control circuit 14 does not have to be cooled by a separate cooling device or a fan. However, a cooling device can be alternatively provided in order to achieve higher output power in any case.

The cable 17, which connects the control circuit 14 to the piezoelectric transformer 1, can be connected to the first housing 11 either firmly or by a detachable connection, for example, a plug-in connection. If the cable 17 is connected to the first housing 11 using a detachable connection, the first housing 11 can be completely removed from the second housing 15 when the connection is disconnected, and be replaced, for example, by another housing. The cable 17 can furthermore also be connected to the second housing 15 either firmly or by a detachable connection, for example, a plug-in connection.

An additional line, through which information for a feedback mechanism is transmitted from the first housing 11 to the second housing 15, can also be integrated into the cable 17. This embodiment will be explained in more detail later on.

As an alternative or in addition, a control element, for example, a switch, can be arranged on the cable 17, which makes it possible to regulate a gas flow and thus adjust what amount of a gaseous process medium is supplied to the piezoelectric transformer 1.

As an alternative or in addition, a hose, through which a process medium is transported out of the second housing 5 into the first housing 11 and, in this way, is supplied to the piezoelectric transformer 1, can be integrated into the cable 17.

The energy supply 16 according to the exemplary embodiment shown in FIG. 2 comprises batteries. The power supply 16 can also be rechargeable batteries. These can optionally be charged by an inductive charging method. Alternatively, the power supply 16 can also be a transformer, which is designed to be connected to a power grid and to transform the mains voltage of the power network to an operating voltage of the device.

The first and the second housing 11, 15 are spatially separated from each other. By the spatial separation of the first and the second housing 11, 15, it can be ensured that a gas exchange between the two housings 11, 15 is minimized. Accordingly, a gas produced in the first housing 11 cannot penetrate or at least can penetrate only in a negligibly low concentration into the second housing 15. In this way, the control circuit 14, arranged in the second housing 15, is protected from irritant gases which are produced during the plasma generation in the first housing 11. Since the control circuit 14 does not come into direct contact with possibly aggressive irritant gases, these have no negative influence on the service life of the device. Accordingly, the spatial separation of the two housings 11, 15 allows for a long service life of the device.

Furthermore, the spatial separation of the piezoelectric transformer 1 and the control circuit 14 and the associated minimization of the gas exchange between the two housings allows the device to integrate also into a consumer product. A consumer product is a product that is used by an end customer, for example, for private use. In doing so, special safety requirements must be met, according to which a user of the device must be protected from potentially harmful irritant gases. It would be possible, for example, to arrange the second housing 15 with the control circuit 14 and with control elements in an area accessible to the end user and to arrange the first housing 11, which comprises the piezoelectric transformer 1 and in which potentially harmful irritant gases can form, in an area that is not directly accessible to the end user. Accordingly, the end user can be protected from the irritant gases by the spatial separation of the piezoelectric transformer 1 and the control circuit 14.

Since the control circuit 14 makes it possible to dispense with separate cooling, overall the design of a small and light handheld device in which the device is integrated is made possible.

In the output region 3 of the piezoelectric transformer 1, electric fields with high field strengths are created during the plasma generation. Due to the spatial separation of the piezoelectric transformer 1 and the control circuit 14 in two separate housings 11, 15 it can be ensured that the control circuit 14 cannot be disturbed by the electric fields.

Further elements of the device can also be integrated in the second housing 15. For example, a time circuit 101, control elements 102 and a control mechanism 103, can be accommodated in the second housing 15. The control elements 102 can make it possible to give commands to the control circuit 14 and thus to control the plasma generation by the piezoelectric transformer 1. The control elements 102 can be push-buttons, knobs, microcontroller-controlled systems with a touchscreen, microcontroller-controlled systems without a touchscreen, a remote control or systems that can be connected to the control circuit via USB, WLAN or Bluetooth and can transmit control commands to it. As an alternative or in addition, the control circuit can be operated by means of an app or another software. The control elements 102 can also be arranged on the cable 17, which connects the first and the second housing 11, 15 to each other.

A gas supply, which is designed to guide a gaseous process medium to the piezoelectric transformer 1, can also be integrated in the second housing 15. A hose, through which the gaseous process medium is introduced into the first housing 11, can also be integrated in the cable 17, which connects the first housing 11 to the second housing 15.

The gas supply can, for example, comprise a fan. The gas supply can comprise a compressor. The gas supply can have connections to which various compressed gas tanks can be connected. For the mixing of different gases, the gas supply can also comprise a gas mixer. The gas supply can have a pressure reducer and/or mass flow controller (MFC), which makes it possible to control the amount of the process medium. Furthermore, the gas supply can comprise a gas humidifier or a gas dryer or a nebulizer or an atomizer. Furthermore, it is conceivable to connect the gas control system to a stationary gas supply via appropriate couplings and thereby to provide the supply. The stationary gas supply can be, for example, a compressed air source or gas pressure lines that provide, for example, $N_2$, $O_2$ or Ar.

The control circuit 14 can be designed to regulate a power and/or gas flow concentration. The control circuit 14 can vary the input voltage applied to the piezoelectric transformer 1 and/or the process medium, which is supplied to the piezoelectric transformer 1. With regard to the process medium, variations of the amount of the supplied process medium as well as of the composition of the supplied process medium are possible. For example, the device can comprise a plurality of gas cartridges, in which different gases are arranged. The process medium can result from a mixture of these gases. By varying the mixing ratio of the gases, the properties of the generated plasma can be changed.

The device can have a sensor 104 that detects, for example, a quantity of ozone generated by the piezoelectric transformer 1. The control circuit 14 can be designed to vary and/or read out at least one of the following parameters, taking into account the values measured by the sensor 104: the input voltage, the amount of the process medium supplied to the transformer 1, the composition of the process medium, the input power and the operating time.

As an alternative or in addition, the device can be designed to detect whether a load is arranged in the immediate vicinity of the transformer 1. The control circuit 14 can be designed to vary at least one of the following parameters when detecting a load: the input voltage, the amount of the process medium supplied to the transformer 1, the composition of the process medium, the input power and the operating time.

The second housing 15 can also comprise a status indicator 107. For example, the status indicator 107 can comprise a light-emitting diode. Different colors or different flashing patterns of the light-emitting diode can communicate information about the operating state or the battery status of the device. The status display can enable a condition and/or performance monitoring of the device.

The device can include circuit components of a remote control 105 and a circuit element 106.

The device can also comprise an optical and/or acoustic irritant gas warning system which warns a user, provided that a predetermined limit value for an irritant gas concentration is exceeded in the immediate vicinity of the device.

In an exemplary embodiment (not shown), a plurality of piezoelectric transformers 1 can be arranged in the first housing 11. The control circuit 14 can be designed to apply an input voltage to each of the transformers 1. The piezoelectric transformers 1 can be operated parallel to each other. In this way, the amount of a generated plasma can be increased.

Figure 3:
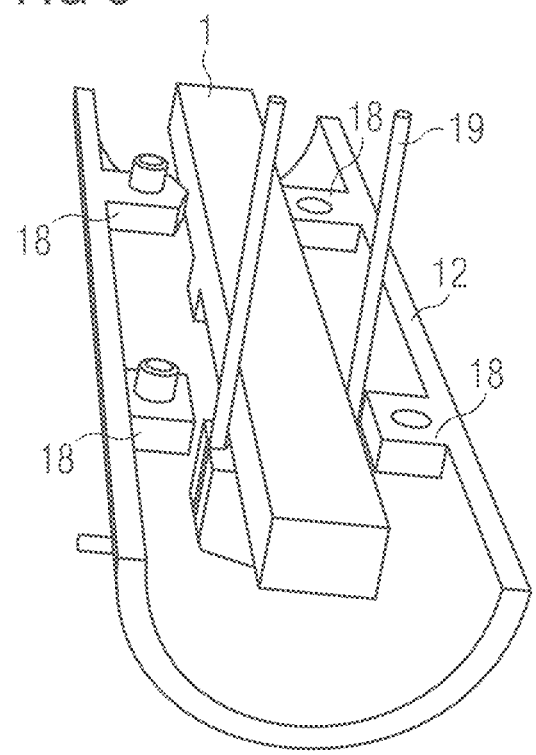
FIG. 3 shows a piezoelectric transformer, which is arranged in a mounting.

FIG. 3 shows the piezoelectric transformer 1, which is fixed in the mounting 12. The mounting 12 has support elements 18, which are arranged in the longitudinal direction z at a length of one quarter and of three quarters of the total length of the piezoelectric transformer 1 and lie on this in a line-shaped manner. Furthermore, the mounting 12 comprises two contact elements 19, which are electrically connected to the external electrodes of the piezoelectric transformer 1. The contact elements 19 are, for example, wires or sheets, for example, of copper, Invar, copper/Invar copper (CIC) or stainless steel. The contact elements 19 can be attached to the piezoelectric transformer 1 and can form a positive-locking connection with the mounting 12. In this way, a movement of the transformer 1 in the longitudinal direction z relative to the mounting 12 can be prevented.

As an alternative to the fastening shown here in the mounting 12, the piezoelectric transformer 1 can also be arranged together with a fan 108 and/or a process-gas supply in a module. Such a module can be arranged in the first housing 11.

Figure 4:
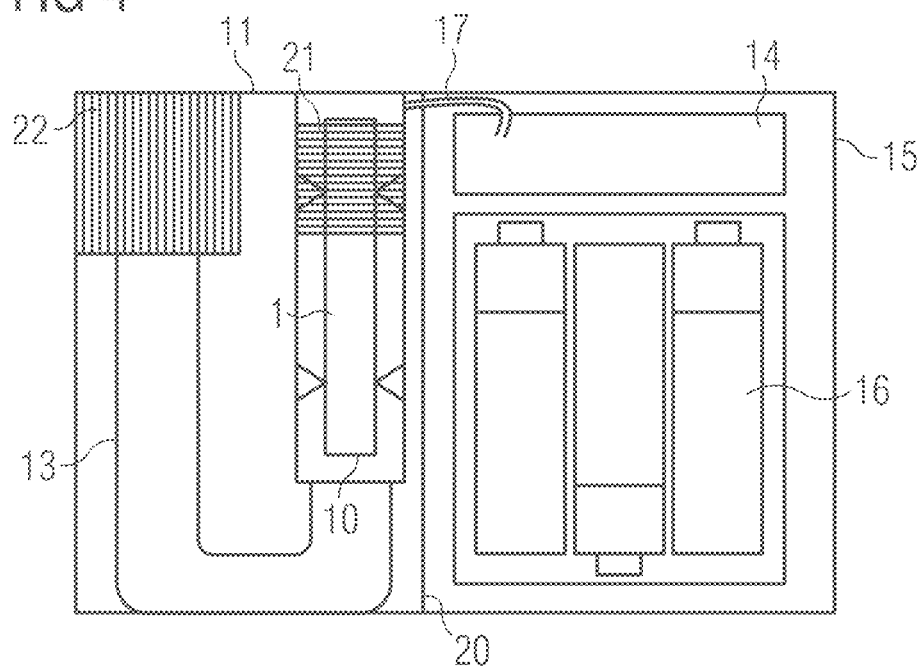
FIG. 4 shows a device for plasma generation according to a second exemplary embodiment.

FIG. 4 shows a second exemplary embodiment of the device, wherein the first housing 11 and the second housing 15 are arranged directly next to each other. The two housings are separated from each other by a common partition wall 20. The partition wall 20 ensures a spatial separation of the transformer 1 arranged in the first housing 11 from the elements arranged in the second housing 15, in particular the control circuit 14 and the energy supply 16.

The first housing 11 also has here a first opening 21, through which ambient air as process medium can be supplied to the piezoelectric transformer 1. The first opening 21 is a slit-shaped grate. The first housing 11 furthermore comprises a second opening 22, through which a plasma generated by the piezoelectric transformer 1 can flow out from the first housing 11. The second opening 22 is also a slit-shaped grate. The first opening 21 and the second opening 22 can each be arranged either on a top side or a bottom side of the first housing 11. The second opening 22 is arranged at the end of the plasma outlet channel 13.

Otherwise, the device shown in FIG. 4 corresponds substantially to the device shown in FIG. 2.

Between the first opening 21 of the first housing 11 and the piezoelectric transformer 1 there can also be arranged an activated-carbon filter (not shown). The activated-carbon filter absorbs ozone and breaks down the ozone quickly and effectively. The first opening 21 forms an inflow opening through which the gaseous process medium flows toward the piezoelectric transformer 1. However, if the gas flow within the first housing 11 is reversed, the activated-carbon filter can prevent ozone from leaking from the first opening 21. Accordingly, the activated-carbon filter increases the safety of the user in the event of any device faults.

The device can also be designed to prevent the leakage of potentially harmful irritant gas from the second opening 22. For this purpose, the device can be provided with a coating, for example, made of manganese dioxide or iron oxide, which breaks down ozone. The coating can be applied, for example, on the inner side of the plasma outlet channel 13. Alternatively, the flow-out of ozone can also be prevented by a filter system, which is arranged at the output-side end face 10 of the piezoelectric transformer 1. Alternatively, since process medium can also be guided in a closed circuit to prevent the ozone from flowing out. Alternatively, it can also be possible that the device is designed in such a way that a flow of the process medium can be reversed in order to suck out the irritant gas in a suction operation.

Figure 5:
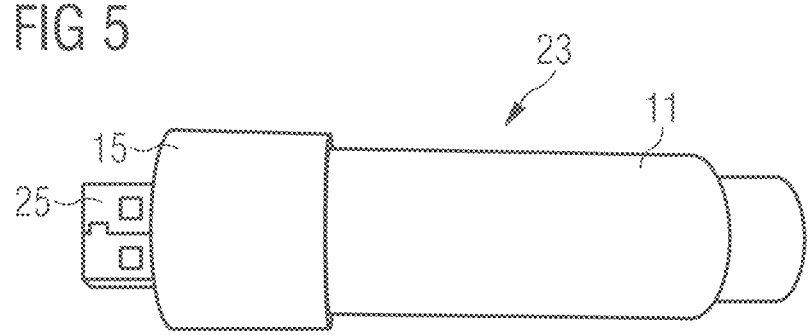
FIGS. 5 to 7 show a device for plasma generation according to a third exemplary embodiment.
Figure 6:
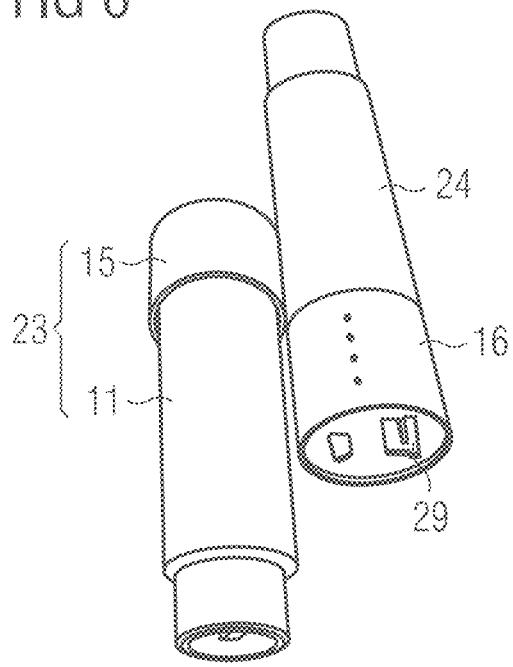
Figure 7:
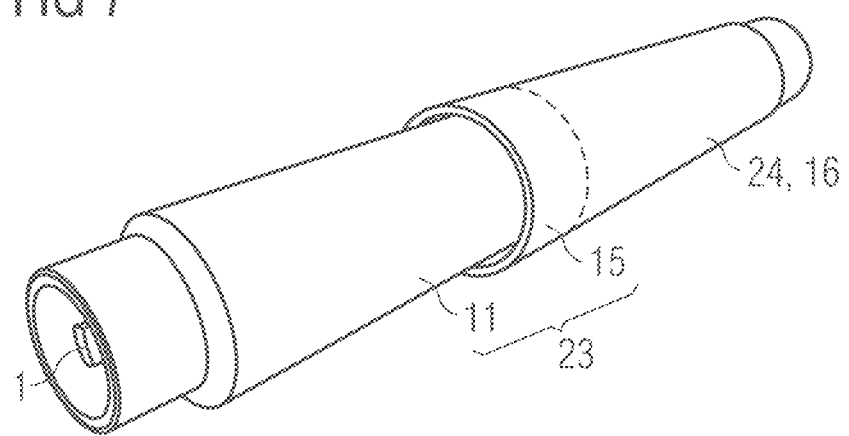

FIGS. 5, 6 and 7 show the device according to a further exemplary embodiment. The device comprises two parts. In particular, the device has a first part 23, which consists of a first housing 11 and a second housing 15, and a second part 24, which consists of an energy supply 16.

FIG. 5 shows the first part 23 of the device. The first housing 11 comprises the piezoelectric transformer 1. The second housing 15 comprises the control circuit 14. The first housing 11 and the second housing 15 are not detachably connected to each other. A non-detachable connection is referred to here as a connection that is not detachable without damaging the first and/or the second housing 11, 15. Thereby, the first and the second housing 11, 15 are spatially separated from each other. Accordingly, the piezoelectric transformer 1 and the control circuit 14 are spatially separated from each other.

The second housing 15 comprises a USB plug 25, which makes it possible to connect the first part 23 to the second part 24. In particular the control circuit 14 can be connected to the energy supply 16 via the USB plug 25.

FIG. 6 shows the first and the second part 23, 24 of the device, wherein both parts 23, 24 are not connected to one another. FIG. 7 shows the first and the second part 23, 24 of the device, wherein both parts 23, 24 are not connected to one another.

The second part 24 consists of the energy supply 16. The energy supply 16 has a USB plug receptacle 29, which is designed to be connected to the USB plug 25 of the first part 23. The second part 24 can be connected to the first part 23 by a USB plug connection. If the two parts 23, 24 are connected to each other, the control circuit 14 is supplied with a voltage by the energy supply 16. In alternative embodiments, the first and the second part 23, 24 can be connected by another plug connection, for example, a bayonet connection.

The second housing 15 does not comprise a built-in rechargeable battery, charging electronics and a DC/DC converter. Accordingly, the first part 23 of the device can be small and compact. The first part 23 of the device can be impervious to impact loads.

The first part 23 of the device can be designed to be connected to any USB accessory via the USB plug 25. For example, a USB extension cable, a USB stand, a USB power bank or a USB power supply can be connected to the first part 23. Furthermore, the control circuit 14 can be connected to a USB interface of a computer via the USB plug 25. Thereby, a configuration of the device can be made via the computer. Alternatively or in addition to the USB connection described here, other standardized low-voltage elements or systems are also conceivable for connecting the first part 23 with other accessories, for example, a micro-USB.

The device shown in FIGS. 5 to 7 offers the advantage that the first part 23 of the device is easily replaceable. The energy supply 16 can be separated from the first part 23 of the device and connected to another part, which also has a piezoelectric transformer 1 and a control circuit 14 in separate housings 11, 15.

The first part 23, comprising the piezoelectric transformer 1 and the control circuit 14, can be replaced as a module. Here, the first part 23 can be replaced by another housing, which also has a piezoelectric transformer 1 and a control circuit 14. The piezoelectric transformer 1 is the component of the device that is subject to the greatest signs of wear. By replacing the first part 23 as a module, it is possible to replace the piezoelectric transformer 1 with a new transformer without having to replace the entire device. In particular, the energy supply 16 can be reused. By replacing the first part 23 as a module, the replacement can be carried out in a simple manner and, for example, carried out by an end customer.

The first part 23 can be replaced by a similar part. Alternatively, the first part can be replaced by a part in which a nozzle is provided, which is designed to form a plasma beam generated by the device or to form a dielectric barrier.

Figure 8:
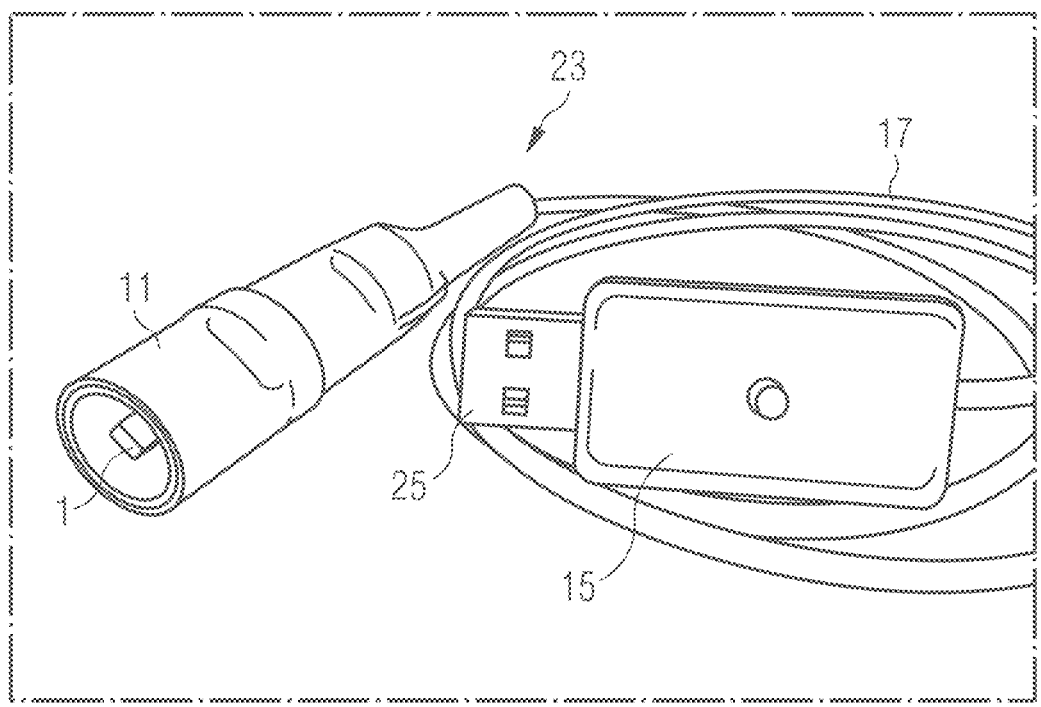
FIG. 8 shows a first part of a device for plasma generation according to a variation of the third exemplary embodiment.

FIG. 8 shows an alternative embodiment of the first part 23 of the device. Here, the first part 23 comprises a first housing 11, in which the piezoelectric transformer 1 is arranged, and a second housing 15, in which the control circuit 14 is arranged. The second housing 15 comprises a USB plug 25. Via the USB plug 25, the second housing 15 can be connected to the energy supply 16. The first housing 11 and the second housing 15 are connected to each other via the cable 17.

Figure 9:
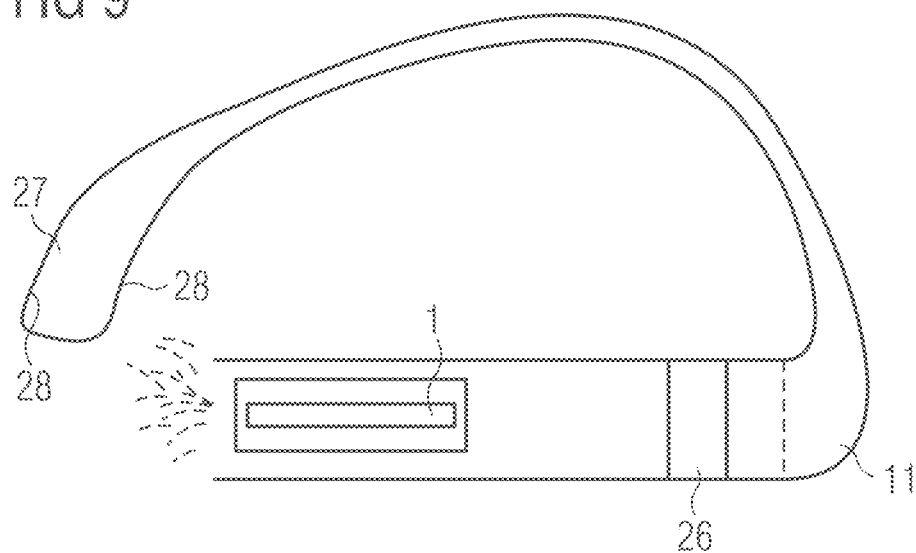
FIG. 9 shows a first housing according to a further exemplary embodiment.

FIG. 9 shows a further exemplary embodiment of the device. In FIG. 9, only the first housing 11 is shown, which comprises the piezoelectric transformer 1. The first housing 11 is designed as a portable handheld device.

The first housing 11 also comprises a fan 26, which serves as a process medium supply. The handheld device also has a suction spout 27, into which air is sucked up. The suction spout 27 is arranged near a plasma outlet opening of the first housing 11. The inner side of the suction spout 27 is coated with an ozone-degrading coating 28, for example, made of manganese dioxide or iron oxide. Irritant gases, which inevitably arise during the plasma production, are sucked up via the suction spout 27, so that the ozone can be broken down quickly and effectively.

The first housing 11 can also comprise a nozzle or a nozzle attachment, which forms the shape of the plasma beam generated by the piezoelectric transformer 1. The nozzle can, for example, be designed to fan the plasma beam or to focus the plasma beam.

The first housing 11 can be connected to a second housing 15, which comprises the control circuit 14. This connection of the two housings 11, 14 is detachable.

The first housing 11, with the piezoelectric transformer 1 and the nozzle, can be removed from the device and replaced as a module. The first housing can be replaced by a third housing, which also comprises a piezoelectric transformer 1 and a nozzle. The piezoelectric transformer 1 is the component of the device that is subject to the greatest signs of wear. By replacing the first housing as a module, it is possible to replace the piezoelectric transformer 1 with a new transformer without having to replace other elements arranged in the second housing. For example, the control circuit 14 can be reused. By replacing the first housing as a module, the replacement can be carried out in a simple manner and, for example, carried out by an end customer.

FIG. 10 shows the first housing 11 according to a further exemplary embodiment. The piezoelectric transformer 1 is arranged in the first housing 11.

The first housing 11 comprises an opening, which is sealed by a coupling plate 30. The coupling plate 30 comprises a non-conductive material. The coupling plate 30 forms a dielectric barrier, wherein plasma can be ignited on the outer side of the coupling plate 30.

On the side of the coupling plate 30, which points away from the piezoelectric transformer 1 there is arranged a metallization 38. The metallization 38 influences the electric field generated by the piezoelectric transformer 1. In this way, the shape of a plasma ignited on the outer side of the coupling plate 30 can be influenced. By a corresponding shaping of the metallization 38, the plasma can be bundled or fanned out.

The device can have a set of coupling plates 30, which are each connectable to the first housing 11. The coupling plates 30 differ here in each case in the form of their metallizations 38. For example, the device can have a first coupling plate 30, which has a metallization, which leads to a bundling of a plasma beam on the outer side of the first coupling plate 30. Furthermore, the device can have a second coupling plate 30, which comprises a differently formed metallization, which leads to a fanning of a plasma beam on the outer side of the first coupling plate 30. Depending on the application of the device, the first housing 11 can be connected either to the first coupling plate 30 or to the second coupling plate 30. The coupling plates 30 can be replaceable.

In the first housing there are furthermore arranged a fan 31, a catalytic converter 32 and a heat exchanger 33. The first housing 11 furthermore comprises a tubular housing element 34, in which the piezoelectric transformer 1 is arranged. Also, the fan 31 and the catalytic converter 32 are arranged in the tubular housing element 34.

The fan 32 is designed to cause a circulating air operation within the first housing 11. In this case, air or another process medium is guided along the piezoelectric transformer 1, then emerges from the tubular housing element 34 and is retracted again into this at a back of the tubular housing element 34. The flow of the process medium is marked in FIG. 10 by arrows. In the flow direction of the process medium during circulating air mode, the catalytic converter 32, the fan 31 and the piezoelectric transformer 1 are arranged in this order in the tubular housing element 34. The catalytic converter 32 is arranged in such a way that the process medium is first guided through the catalytic converter 32 before it again reaches the piezoelectric transformer 1.

The catalytic converter 32 is designed to break down an irritant gas, in particular ozone. For example, the catalytic converter 32 can be an activated-carbon filter. Alternatively or in addition to the activated-carbon filter, the catalytic converter can have a filter based on manganese dioxide or a filter based on $MnO_2$. Manganese dioxide can herein be present in the form of a coating.

The process medium is ionized on the piezoelectric transformer 1. Thereby ozone and plasma are generated. Plasma is also generated outside the first housing 11 by a dielectric barrier discharge via the coupling plate 30. The ozone and other irritant gases remain within the first housing 11 and are supplied to the catalytic converter 32 due to the circulating air operation and broken down there.

When operating the piezoelectric transformer 1, this is heated so that significant heat is emitted from the transformer 1 to the interior of the housing 11. Also, during the ionization of the process medium, further heat forms within the first housing 11. To prevent overheating of the interior of the first housing 11, the first housing 11 comprises a heat exchanger 35. The heat exchanger 35 is arranged at the end of the first housing 11 located opposite from the coupling plate 30. The heat exchanger 35 is designed to release heat located in the first housing 11 into an environment.

Figure 13:
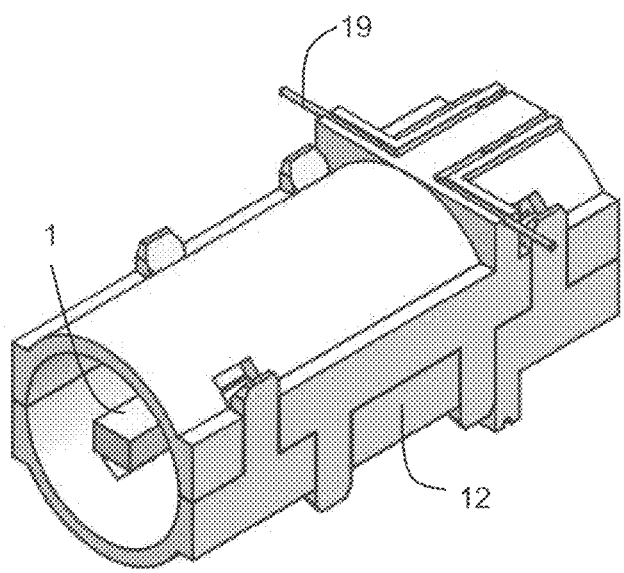
Figure 14:
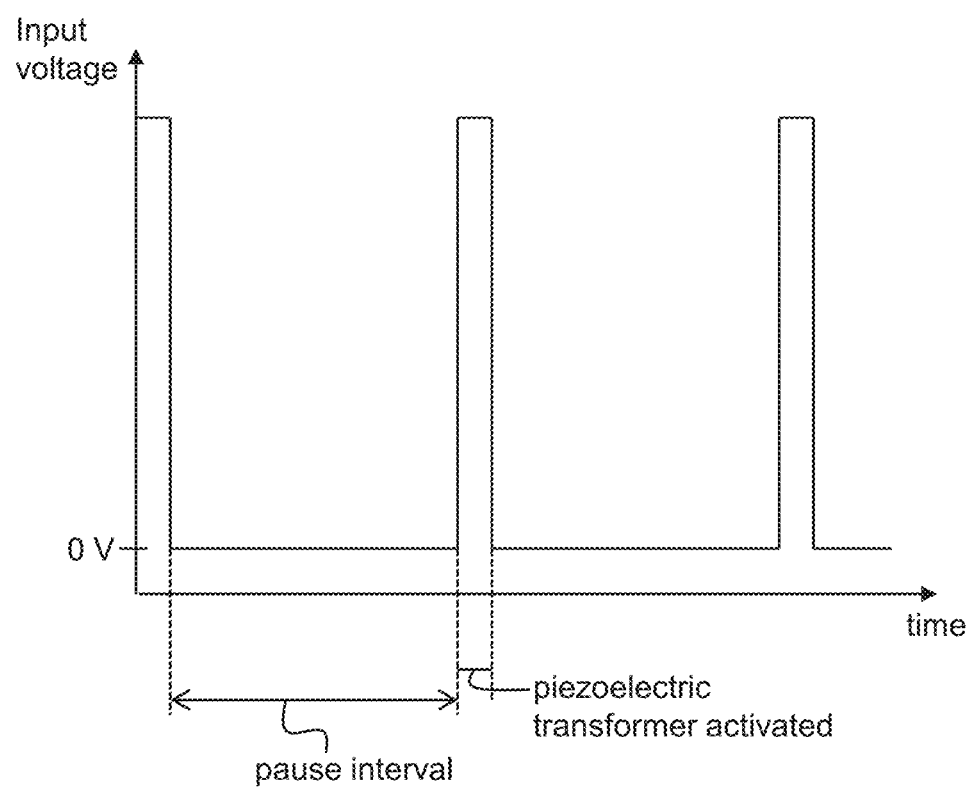

FIGS. 11 to 13 show an alternative embodiment of the mounting 12 shown in FIG. 3, to which the piezoelectric transformer 1 can be attached. The mounting 12 is composed of two identical half shells 12a, 12b that can be connected to each other.

FIG. 11 shows a first half shell 12a of the mounting 12. FIG. 12 also shows the first half shell 12a of the mounting 12, wherein the piezoelectric transformer 1 and two contact elements 19 for its contacting are furthermore shown. FIG. 13 shows both half shells 12a, 12b of the mounting 12 as well as the piezoelectric transformer 1 attached in the mounting 12 and the contact elements 19 for its contacting.

In contrast to the mounting 12 shown in FIG. 3, the mounting 12 shown in FIGS. 11 to 13 has only one support element 18 on which the piezoelectric transformer 1 rests at its state of rest. A state of rest is referred to here as a state at which no electrical voltage is applied to the transformer 1 and in which no external forces act, for example, as a result of an impact on the device. The support element 18 is arranged in the longitudinal direction at a length of a quarter of the total length of the transformer 1. The support element 18 runs in a wedge-shape manner so that the transformer 1 rests on the support element 18 in a line-shaped manner. The contact elements 19 are arranged and attached to the first support element 18.

The device does not have any support elements 18 which are located in the output region of the piezoelectric transformer 1.

The device furthermore comprises two projections 36, 37, which are spaced a few micrometers away from the piezoelectric transformer 1 when the transformer 1 is at its state of rest. If the transformer 1 is moved as a result of a transverse movement, for example, due to an impact or as a result of a deformation by an applied voltage, it strikes against one or both of the projections 36, 37, which thus limit the transverse load of the transformer 1 and form a mechanical end-stop against transverse movements of the transformer 1. A first projection 36 is arranged in the center of the transformer 1. The second projection 37 is arranged at the input-side end of the transformer 1.

The invention claimed is:

1. A device comprising:
    a first housing, in which a piezoelectric transformer is arranged; and
    a second housing, in which a control circuit is arranged, wherein the control circuit is configured to apply an input voltage to the piezoelectric transformer,
    wherein the control circuit comprises a time circuit,
    wherein the device is configured to operate in a pulsed mode in which time intervals in which the piezoelectric transformer is activated and pause intervals in which the piezoelectric transformer is deactivated alternate,
    wherein the piezoelectric transformer is activated in the time intervals based on the time circuit without taking into account other operating parameters of the piezoelectric transformer,
    wherein the piezoelectric transformer is deactivated in the pause intervals based on the time circuit,
    wherein a length of a pause interval is determined by a purely time-based control system, and
    wherein the device is configured to produce a non-thermal atmospheric pressure plasma.

2. The device according to claim 1, further comprising at least one control element arranged at the first housing or the second housing, the at least one control element configured to control generation of the plasma.

3. The device according to claim 1, wherein the first housing comprises a coating configured to eradicate irritant gases.

4. The device according to claim 3, wherein the coating comprises manganese dioxide, iron oxide, other metal oxides, bare metal surfaces or surface coated with metal catalysts, or lacquers.

5. The device according to claim 1, wherein the piezoelectric transformer is configured to produce piezoelectrically ignited microplasma on an output-side end face of the piezoelectric transformer.

6. The device according to claim 1, wherein the first housing and the second housing are separate from each other.

7. The device according to claim 1, wherein the control circuit and the piezoelectric transformer are connected to each other via a cable.

8. The device according to claim 7, wherein the cable has a length of at least 1 cm.

9. The device according to claim 1, wherein the first housing comprises a nozzle, which is arranged in front of an end face of the piezoelectric transformer and which is configured to form a plasma beam generated by the piezoelectric transformer.

10. The device according to claim 1, further comprising a third housing, comprising a piezoelectric transformer, wherein the first housing is replaceable by the third housing.

11. The device according to claim 1, wherein the first housing is configured to eradicate irritant gases produced during plasma production.

12. The device according to claim 11, wherein the first housing comprises a filter and/or a closed gas guidance system and/or a suction device configured to eradicate the irritant gases.

13. The device according to claim 1, further comprising a control mechanism configured to adjust an amount and/or a composition of a process medium supplied to the piezoelectric transformer.

14. The device according to claim 1, further comprising an attachment attached to the first housing, wherein the attachment forms a dielectric barrier immediately in front of an output-side end face of the piezoelectric transformer so that the device is configured to ignite a plasma by dielectric barrier discharge on a side of the dielectric barrier facing away from the piezoelectric transformer.

15. The device according to claim 1, wherein a plurality of piezoelectric transformers are arranged in the first housing.

16. The device according to claim 1, wherein the first housing and the second housing are formed by two chambers of an injection-molded part.

17. The device according to claim 1, wherein the first housing and the second housing are separated from each other in a watertight manner.

18. The device according to claim 1, wherein the first housing and the second housing are separated from each other in a gastight manner.

19. The device according to claim 1, wherein an energy supply of the device is arranged in the second housing.

20. The device according to claim 1, wherein the device is a portable handheld device.

21. The device according to claim 1,
wherein process-gas-supply means are arranged in the second housing, and
wherein the device comprises a hose configured to guide a process gas from the process-gas-supply means out of the second housing to the piezoelectric transformer arranged in the first housing.

22. The device according to claim 1, further comprising a suction spout configured to suck up irritant gas produced by the piezoelectric transformer, wherein the irritant gas is eradicated in the suction spout.

23. The device according to claim 1, further comprising a sensor configured to determine a filling level, temperature or humidity inside or in surroundings of an active space.

24. The device according to claim 1, further comprising circuit components of a remote control configured to control a control system.

25. The device according to claim 1, further comprising circuit elements configured to report operating times, errors, status information, and operating parameters.

26. The device according to claim 1, further comprising one or more indicators for optical or acoustic signaling of one or more operating parameters.

27. The device according to claim 1, wherein the device is configured to enable, accelerate or catalyze chemical reactions.

28. The device according to claim 1, wherein the device is configured to activate or to sterilize surfaces.

29. The device according to claim 1, wherein the device is configured to clean or to treat wounds of a human or an animal.

30. The device according to claim 1, further comprising a fan and a catalytic converter arranged in the first housing, wherein the fan is configured to ensure a circulating air operation thereby guiding a process medium ionized by the piezoelectric transformer in the first housing within a circuit, and through the catalytic converter before the process medium is supplied back to the piezoelectric transformer.

31. The device according to claim 1, wherein the first housing comprises a heat exchanger configured to dissipate heat from an inside of the first housing to an environment.

32. The device according to claim 1, further comprising at least one projection, which is spaced apart from the piezoelectric transformer when the piezoelectric transformer is at a state of rest, and which forms an end-stop against transverse movements of the piezoelectric transformer, wherein an input region of the piezoelectric transformer rests on a first support element.

33. The device according to claim 32, wherein the projection is arranged at half a length of the piezoelectric transformer.

34. The device according to claim 32, further comprising a second projection, which is spaced apart from the piezoelectric transformer when the piezoelectric transformer is at a state of rest, and which forms an end-stop against transverse movements of the piezoelectric transformer, and wherein the second projection is arranged at an input-side end of the piezoelectric transformer.

35. The device according to claim 1,
wherein the first housing is sealed by a coupling plate, the coupling plate comprising a dielectric material, and
wherein a metallization is arranged on an outer side of the coupling plate pointing away from the piezoelectric transformer.

36. The device according to claim 1,
wherein the first housing is connectable to a first coupling plate comprising a dielectric material and a first metallization on an outer side pointing away from the piezoelectric transformer, or to a second coupling plate comprising a dielectric material and a second metallization on an outer side pointing away from the piezoelectric transformer, and
wherein the first metallization has a different shape than the second metallization.

37. An active space comprising:
the device according to claim 1; and
a gas volume that is airtight or a gas volume that is not airtight.

38. The active space according to claim 37, wherein the active space comprises a cover, wherein the device is arranged on the cover, and wherein a plasma outlet opening of the device points away from the cover.

39. The active space according to claim 38, further comprising a sensor configured to detect an opening and closing of the cover, wherein the device is configured to produce plasma after closing the cover.

40. A method for producing a non-thermal atmospheric pressure plasma with a device comprising a first housing in which a piezoelectric transformer is arranged and a second housing in which a control circuit is arranged, wherein the control circuit comprises a time circuit and is configured to apply an input voltage to the piezoelectric transformer, the method comprising:
operating the device in a pulsed mode, wherein operating comprises:
activating the piezoelectric transformer in a first time interval of the pulsed mode based on the time circuit without taking into account other operating parameters of the piezoelectric transformer by applying the input voltage to the piezoelectric transformer such that the piezoelectric transformer generates the non-thermal atmospheric pressure plasma during the first time interval; and deactivating the piezoelectric transformer in a pause interval of the pulsed mode based on the time circuit by not applying the input voltage to the piezoelectric transformer in the pause interval, wherein the first time interval and the pause interval alternate, and wherein a length of the pause interval is determined by a purely time-based control system.

* * * * *